(12) United States Patent
Ma et al.

(10) Patent No.: US 10,312,293 B2
(45) Date of Patent: Jun. 4, 2019

(54) ORGANIC LIGHT-EMITTING DIODE, DISPLAY PANEL AND DISPLAY DEVICE

(71) Applicant: SHANGHAI TIANMA AM-OLED CO., LTD., Shanghai (CN)

(72) Inventors: Huihui Ma, Shanghai (CN); Xiangcheng Wang, Shanghai (CN); Yuji Hamada, Shanghai (CN); Jinghua Niu, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 15/890,985

(22) Filed: Feb. 7, 2018

(65) Prior Publication Data

US 2018/0166509 A1    Jun. 14, 2018

(30) Foreign Application Priority Data

Jul. 28, 2017  (CN) .......................... 2017 1 0632927

(51) Int. Cl.
| | |
|---|---|
| *H01L 51/52* | (2006.01) |
| *H01L 27/32* | (2006.01) |
| *H01L 51/50* | (2006.01) |
| *G09G 3/3258* | (2016.01) |

(52) U.S. Cl.
CPC ....... *H01L 27/3209* (2013.01); *G09G 3/3258* (2013.01); *H01L 51/5044* (2013.01); *H01L 51/5072* (2013.01); *H01L 51/5206* (2013.01); *H01L 51/5221* (2013.01); *H01L 51/5278* (2013.01); *G09G 2310/0264* (2013.01)

(58) Field of Classification Search
CPC ........... H01L 51/0007; H01L 51/00072; H01L 51/0067; H01L 51/5044; H01L 51/5072; H01L 51/5221; H01L 51/5278
See application file for complete search history.

(56) References Cited

U.S. PATENT DOCUMENTS

| | | | |
|---|---|---|---|
| 2016/0126466 A1* | 5/2016 | Jeong | .................. H01L 51/0072 257/40 |
| 2017/0186963 A1* | 6/2017 | Ren | ..................... H01L 51/0067 |
| 2017/0256718 A1* | 9/2017 | Wang | .................. H01L 51/0071 |

(Continued)

FOREIGN PATENT DOCUMENTS

| | | |
|---|---|---|
| CN | 101330129 A | 12/2008 |
| CN | 101728485 A | 6/2010 |

(Continued)

*Primary Examiner* — Cuong Q Nguyen
(74) *Attorney, Agent, or Firm* — Alston & Bird LLP (57) ABSTRACT

The application discloses an organic light-emitting diode for a display panel. The organic light-emitting diode includes an anode, a cathode, at least two emitting layers arranged between the anode and the cathode, and a charge generation layer arranged between every two adjacent emitting layers, wherein the charge generation layer includes a first layer unit and a second layer unit which are arranged in sequence, the first layer unit includes a hole injection material and a P-type semiconductor material doped in the hole injection material, and the second layer unit includes an electron transport material and ytterbium doped in the electron transport material, wherein a volume concentration of ytterbium doped in the electron transport material ranges from 1% to 5%.

17 Claims, 4 Drawing Sheets

(56) References Cited

U.S. PATENT DOCUMENTS

2017/0256729 A1* 9/2017 Wang ................. H01L 51/0071
2018/0371274 A1* 12/2018 Tan .................... H01L 51/0007

FOREIGN PATENT DOCUMENTS

| CN | 102185112 A | 9/2011 |
| CN | 104752624 A | 7/2015 |
| CN | 106062986 A | 10/2016 |
| CN | 106848084 A | 6/2017 |

* cited by examiner

ORGANIC LIGHT-EMITTING DIODE, DISPLAY PANEL AND DISPLAY DEVICE

CROSS REFERENCE TO RELATED APPLICATIONS

This application claims priority to Chinese Patent Application No. CN201710632927.0, filed on Jul. 28, 2017, the entire content of which is incorporated herein by reference.

FIELD

This application relates to the technical field of display, and in particular to an organic light-emitting diode, a display panel and a display device.

BACKGROUND

With advantages of low drive voltage, high luminous brightness, high luminous efficiency, wide luminous viewing angle, high response speed, ultrathin shape, light weight and compatible flexible substrate, Organic Light-Emitting Diode (OLED) occupies an important position in the field of display.

The structure of the organic light-emitting diode usually includes a substrate, an anode, a Hole Injection Layer (HIL), a Hole Transport Layer (HTL), an Emitting Layer (EML), an Electron Transport Layer (ETL), an Electron Injection Layer (EIL) and a cathode which are arranged in sequence in an overlaying manner. The emitting unit of the structure can form an energy level state in a ladder form, such that the holes and electrons can be easily transported to the emitting layer, where the HIL, HTL, EML, ETL and EIL are all organic-material layers.

However in the current technologies, the drive voltage of the organic light-emitting diode is higher than previous display devices, the luminous efficiency is lower, and the performance of the organic light-emitting diodes needs to be further improved.

SUMMARY

The embodiment of the present disclosure is to provide an organic light-emitting diode, a display panel and a display device, so as to lower the drive voltage of the organic light-emitting diode and improve the luminous efficiency of the organic light-emitting diode.

The organic light-emitting diode according to an embodiment of the present disclosure includes an anode, a cathode, at least two emitting layers arranged between the anode and the cathode, and a charge generation layer arranged between every two adjacent emitting layers, where the charge generation layer includes a first layer unit and a second layer unit which are arranged in sequence along the direction far away from the cathode, the first layer unit includes a hole injection material and a P-type semiconductor material doped in the hole injection material, and the second layer unit includes an electron transport material doped with ytterbium, where a volume concentration of ytterbium dopants in the electron transport material ranges from 1% to 5%; the P-type semiconductor material includes the following compound:

where n is an integer greater than or equal to 1, $X_1$, $X_2$ and $X_3$ each has an independent structure of R' is selected from any one of substituted aryl and substituted hetero aryl, and the substituent in the substituted aryl and substituted hetero aryl at least includes one electron acceptor group.

The embodiment of the present disclosure further provides a display panel, and the display panel includes an organic light-emitting diode. The organic light-emitting diode includes an anode, a cathode, at least two emitting layers arranged between the anode and the cathode, and a charge generation layer arranged between every two adjacent emitting layers, where the charge generation layer includes a first layer unit and a second layer unit which are arranged in sequence along the direction far away from the cathode, the first layer unit includes a hole injection material and a P-type semiconductor material doped in the hole injection material, and the second layer unit includes an electron transport material and ytterbium doped in the electron transport material, where a volume concentration of ytterbium doped in the electron transport material ranges from 1% to 5%; the P-type semiconductor material includes the following compound:

where n is an integer greater than or equal to 1, $X_1$, $X_2$ and $X_3$ each has an independent structure of

R' is selected from any one of substituted aryl and substituted hetero aryl, and the substituent in the substituted aryl and substituted hetero aryl at least includes one electron acceptor group.

The embodiment of the present disclosure further provides a display device, and the display device includes a display panel. The display panel includes an organic light-emitting diode. The organic light-emitting diode includes an anode, a cathode, at least two emitting layers arranged between the anode and the cathode, and a charge generation layer arranged between every two adjacent emitting layers, where the charge generation layer includes a first layer unit and a second layer unit which are arranged in sequence along the direction far away from the cathode, the first layer unit includes a hole injection material and a P-type semiconductor material doped in the hole injection material, and the second layer unit includes an electron transport material and ytterbium doped in the electron transport material, where a volume concentration of ytterbium doped in the electron transport material ranges from 1% to 5%; the P-type semiconductor material includes the following compound:

where n is an integer greater than or equal to 1, $X_1$, $X_2$ and $X_3$ each has an independent structure of R' is selected from any one of substituted aryl and substituted hetero aryl, and the substituent in the substituted aryl and substituted hetero aryl at least includes one electron acceptor group.

DETAILED DESCRIPTION OF THE EMBODIMENTS

In order to lower the drive voltage of the organic light-emitting diode and improve the luminous efficiency of the organic light-emitting diode, embodiments of the present disclosure provide an organic light-emitting diode, a display panel and a display device. In order to make the objective, technical solution and advantages of the present disclosure clearer, the present disclosure will be further described in detail below with the embodiments as examples.

Figure 5:
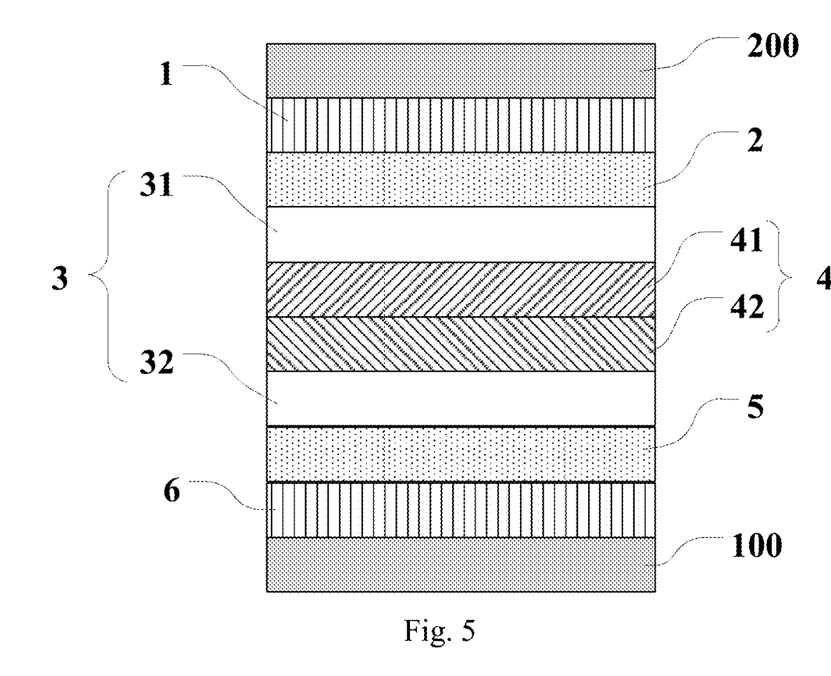
FIG. 5 is a schematic structural diagram of an organic light-emitting diode in an embodiment of the present disclosure.

As shown in FIG. 5, the organic light-emitting diode according to an embodiment of the present disclosure includes an anode 100, a cathode 200, at least two emitting layers 3 arranged between the anode 100 and the cathode 200, and a charge generation layer 4 arranged between every two adjacent emitting layers 3.

The charge generation layer 4 includes a first layer unit 410 and a second layer unit 420 which are arranged in sequence along the direction far away from the cathode 200. The first layer unit 410 includes a hole injection material and a P-type semiconductor material doped in the hole injection material, and the second layer unit 420 includes an electron transport material doped with ytterbium, where the volume concentration of ytterbium doped in the electron transport material ranges from 1% to 5%;

The P-type semiconductor material includes the following compound:

Where n is an integer greater than or equal to 1, $X_1$, $X_2$ and $X_3$ all independently have a structure of

R' is selected from any one of substituted aryl and substituted hetero aryl, and the substituent in the substituted aryl and substituted hetero aryl at least includes one electron acceptor group.

Where the above substituted aryl can include substituted phenyl, substituted xenyl, substituted naphthyl, substituted methyl phenyl, or substituted ethyl phenyl, etc.

Where the above substituted hetero aryl can include substituted pyridyl, substituted furyl, substituted pyrryl, substituted thienyl, substituted thiazolyl or substituted pyranyl, etc.

Firstly, in the embodiment of the present disclosure, the second layer unit 420 of the charge generation layer includes ytterbium material doped in the electron transport material, and forms a P-I-N structure together with the first layer unit 410. The charge generation layer is arranged between emitting layers to lower the injection energy barrier of the holes and electrons. In addition, the electronic mobility of the ytterbium material is high, the electron injection capability of the organic light-emitting diode can be improved, then more electrons migrate to the emitting layer, thereby balancing the quantity of the electrons and the quantity of the holes in the emitting layer, and improving the luminous efficiency of the organic light-emitting diode.

Secondly, in the embodiment of the present disclosure, the P-type semiconductor material includes the compound the compound is a radialene compound. Radialenes are alicyclic organic compounds containing n cross-conjugated exocyclic double bonds. The double bonds are commonly alkene groups but those with a carbonyl (C=O) group are also called radialenes. The radialene compound can be used as an organic dopant doped with organic semiconductor to change the electrical property of the semiconductor matrix material, as a blocker material and a charge injection layer, and as an electrode material. The compound of the present embodiment is connected with an electron acceptor group— CN (any chemical compound that contains a carbon atom triple-bonded to a nitrogen atom) which has a strong electron withdrawing capability, thereby being beneficial for generating more holes. In the embodiment of the present disclosure, the P-type semiconductor material includes the compound, then the hole injection capability of the first layer unit 410 can be improved, and the holes and electrons can be migrated to the emitting layer under a lower voltage, thereby lowering the drive voltage of the organic light-emitting diode, and reducing the power consumption of the organic light-emitting diode.

Thirdly, in the embodiment of the present disclosure, ytterbium doped in the electron transport material can improve the electron transport capability of the electron transport material, such that a large number of electrons can be migrated to the emitting layer. The hole injection and transport capability of the first layer unit 410 and the electron injection and transport capability of the second layer unit 420 are all improved, then the quantity of holes and the quantity of electrons migrated to the emitting layer are large and balanced, and the holes and the electrons can be combined to generate more carriers, thereby improving the luminous efficiency of the organic light-emitting diode.

Several types of organic light-emitting diodes are available in the prior art, however, they all have certain defects, for example.

Figure 1:
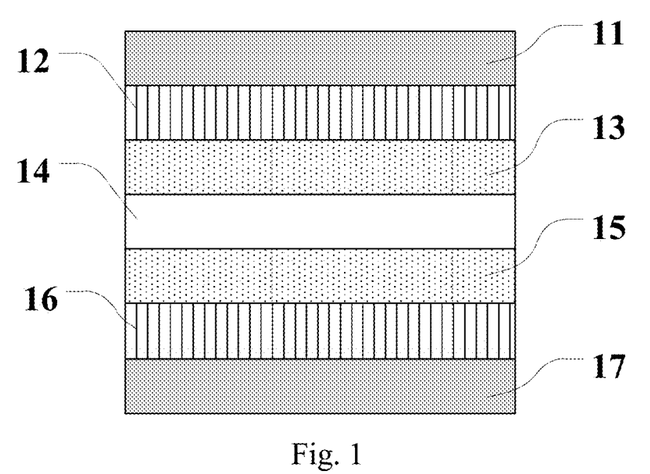
FIG. 1 is a conventional schematic structural diagram of an organic light-emitting diode.

FIG. 1 is a conventional schematic structural diagram of an organic light-emitting diode. The organic light-emitting diode includes a cathode 11, an electron injection layer 12, an electron transport layer 13, a white organic emitting layer 14, a hole transport layer 15, a hole injection layer 16 and an anode 17 which are arranged in sequence. The organic light-emitting diode is provided with a single-layer white organic emitting layer, but few materials are available for fabricating the white organic emitting layer, and the materials with high efficiency and low voltage are difficult to be obtained.

Figure 2:
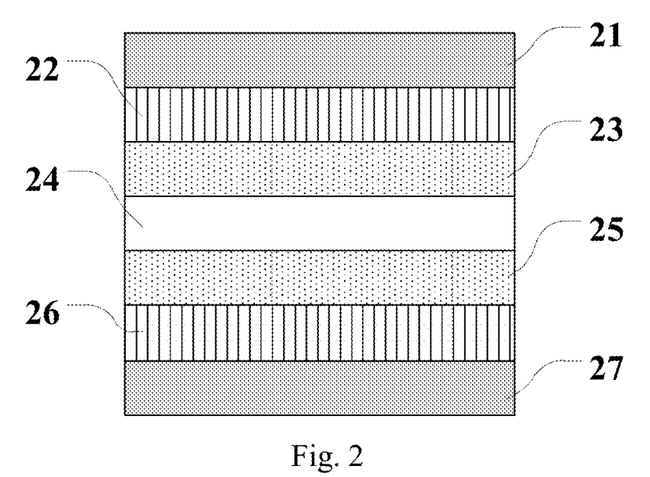
FIG. 2 is a conventional schematic structural diagram of another organic light-emitting diode.

FIG. 2 is a conventional schematic structural diagram of another organic light-emitting diode. The organic light-emitting diode includes a cathode 21, an electron injection layer 22, an electron transport layer 23, an organic emitting layer 24, a hole transport layer 25, a hole injection layer 26 and an anode 27 which are arranged in sequence. The organic light-emitting diode includes an organic emitting layer, the organic emitting layer is fabricated with multiple light-emitting materials being doped together, e.g., two light-emitting materials are doped into one organic emitting layer. When the organic emitting layer is fabricated, the process for adjusting the doping components of each material is complex, and it is difficult to adjust to a high-efficiency state.

Figure 3:
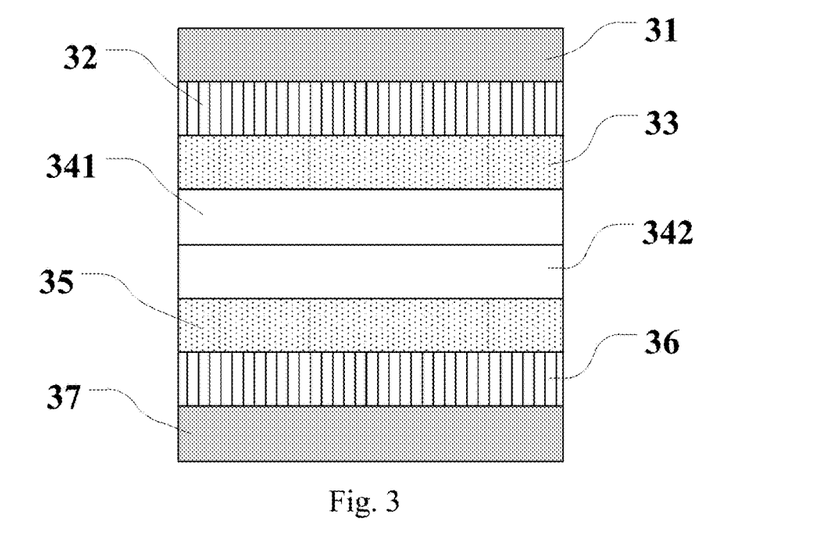
FIG. 3 is a conventional schematic structural diagram of still another organic light-emitting diode.

FIG. 3 is a conventional schematic structural diagram of still another organic light-emitting diode. The organic light-emitting diode includes a cathode 31, an electron injection layer 32, an electron transport layer 33, a first emitting layer 341, a second emitting layer 342, a hole transport layer 35, a hole injection layer 36 and an anode 37 which are arranged in sequence. The organic light-emitting diode includes at least two organic emitting layers, and the above at least two emitting layers are arranged to be adjacent to each other. For the organic light-emitting diode adopting such a structure, with the change of the drive voltage, the quantity of the electrons and the quantity of the holes injected into each emitting layer are also changed, and then the light-emitting recombination center is moved, thereby leading to unstable luminous color and poorer luminous effect.

Figure 4:
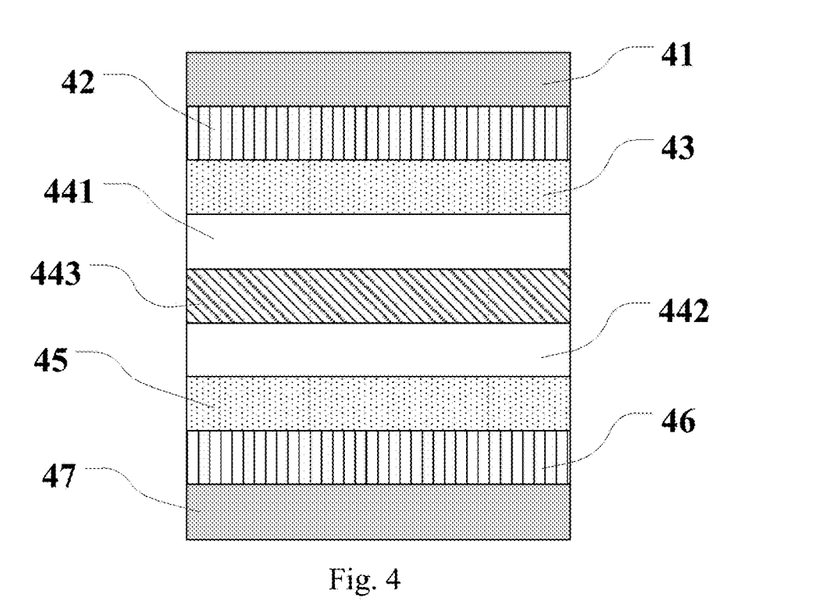
FIG. 4 is a conventional schematic structural diagram of yet another organic light-emitting diode.

FIG. 4 is a conventional schematic structural diagram of yet another organic light-emitting diode. The organic light-emitting diode includes a cathode 41, an electron injection layer 42, an electron transport layer 43, a first emitting layer 441, a charge generation layer 443, a second emitting layer 442, a white organic emitting layer 44, a hole transport layer 45, a hole injection layer 46 and an anode 47 which are arranged in sequence. The organic light-emitting diode includes at least two organic emitting layers, and a charge generation layer is arranged between every two adjacent organic emitting layers. Compared with the above three organic light-emitting diodes, the organic light-emitting diode adopting such a structure has the advantages of favorable color stability, high efficiency and long service life. Therefore, those skilled in the art pay more attention to the research and development of overlaid organic light-emitting diode.

However, the organic light-emitting diode shown in FIG. 4 also has some defects: since the conductivity of electrons of most organic materials is far less than the conductivity of holes, such that the quantity of the electrons and the quantity of the holes in the emitting layer are not balanced, and the recombination efficiency of excitons is lower, so the drive voltage of the organic light-emitting diode is higher, the luminous efficiency is lower and the performance of the organic light-emitting diode needs to be further improved.

FIG. 5 is a schematic structural diagram of the organic light-emitting diode in an embodiment of the present disclosure. The organic light-emitting diode includes a cathode 200, an electron injection layer 1, an electron transport layer 2, a first emitting layer 310, a first layer unit 410, a second layer unit 420, a second emitting layer 320, a hole transport layer 5, a hole injection layer 6 and an anode 100 which are arranged in sequence. Compared with the organic light-emitting diodes in the prior art, the organic light-emitting diode in the present embodiment has numerous advantages, more apparently, the organic light-emitting diode can enable more electrons to migrate to the emitting layer, so as to balance the quantity of the electrons and the quantity of the holes in the emitting layer, improve the luminous efficiency of the organic light-emitting diode and lower the drive voltage of the organic light-emitting diode.

Comparative analysis experiments have been performed using different materials for the charge generation layer of the organic light-emitting diodes. In these experiments, the drive voltage and luminous efficiency of each organic light-emitting diode were analyzed. The influence of doping the P-type semiconductor material in the hole injection material and doping ytterbium in the electron transport material over the drive voltage and luminous efficiency of the organic light-emitting diode was understood. Specifically, three groups of organic light-emitting diodes were selected for experiments. The first group: the first layer unit includes the hole injection material and the P-type semiconductor material doped in the hole injection material, and the second layer unit includes the electron transport material and ytterbium doped in the electron transport material; the second group: the first layer unit includes hole injection material and P-type semiconductor material doped in the hole injection material, and the second layer unit includes the electron transport material; and the third group: the first layer unit includes hole injection material, and the second layer unit includes the electron transport material and ytterbium doped in the electron transport material. The data record of the experiment is as shown in Table I.

| Name | Drive voltage/V | Luminous efficiency/% |
| --- | --- | --- |
| First group | 7.21 | 11.59 |
| Second group | 8.65 | 10.01 |
| Third group | 8.32 | 9.58 |

Table I is an Experimental Data Record Table of Comparative Analysis of Material Selection of the Charge Generation Layer It should be noted that, the P-type semiconductor material mentioned in the above comparative analysis experiment includes a compound It can be seen from the experiment data of Table I that, when the charge generation layer includes P-type semiconductor material doped in the hole injection material and ytterbium doped in the electron transport material, the drive voltage required by the organic light-emitting diode is small and the luminous efficiency is high.

Specifically, through numerous experiments and calculations, the inventor discovered that when the volume concentration of ytterbium material doped in the electron transport material ranges from 1% to 5%, the effect of lowering the drive voltage of the organic light-emitting diode is favorable, and the degree by which the luminous efficiency is improved is high. Specifically, aiming at different volume concentrations of ytterbium material doped in the electron transport material, the inventor conducted a comparative analysis experiment on the drive voltage and luminous efficiency of organic light-emitting diode. In the experiment, the volume concentration of 5% of the P-type semiconductor material doped in the hole injection material is selected to be unchanged, while the volume concentration of ytterbium material doped in the electron transport material is changed. Specifically, the volume concentrations of ytterbium material doped in the electron transport material are respectively selected to be 0.5%, 1%, 3%, 5% and 8%, and the data record of the experiment is as shown in Table II.

| No. | Doping concentration of ytterbium/% | Drive voltage/V | Luminous efficiency/% |
|---|---|---|---|
| 1 | 0.5 | 8.05 | 8.56 |
| 2 | 1 | 7.27 | 11.23 |
| 3 | 3 | 7.21 | 11.59 |
| 4 | 5 | 7.18 | 11.02 |
| 5 | 8 | 7.16 | 7.08 |

Table II is an Experimental Data Record Table of the Volume Concentration Changes of Ytterbium Material Doped in the Electron Transport Material It can be seen from the experimental data of Table II that, when the volume concentration of ytterbium material doped in the electron transport material ranges from 1% to 5%, the drive voltage of the organic light-emitting diode is lower and the luminous efficiency is higher. For example, the volume concentrations of ytterbium material can be 1.3%, 1.6%, 1.9%, 2%, 2.5%, 2.8%, 3.1%, 3.3%, 3.8%, 4%, 4.2%, 4.5% or 4.9%, etc.

In an optional embodiment, the volume concentration of the P-type semiconductor material doped in the hole injection material ranges from 1% to 10%. Aiming at different volume concentrations of P-type semiconductor material doped in the hole injection material, the inventor conducted a comparative analysis experiment on the drive voltage and luminous efficiency of the organic light-emitting diode. In the experiment, the volume concentration of 3% of the ytterbium material doped in the electron transport material is selected to be unchanged, while the volume concentration of P-type semiconductor material doped in the hole injection material is changed, specifically, the volume concentrations of the P-type semiconductor material doped in the hole injection material are respectively selected to be 0.5%, 1%, 5%, 10% and 12%, and the data record of the experiment is as shown in Table III.

| No. | Doping concentration of the P-type semiconductor material/% | Drive voltage/V | Luminous efficiency/% |
|---|---|---|---|
| 1 | 0.5 | 8.19 | 8.82 |
| 2 | 1 | 7.25 | 11.16 |
| 3 | 5 | 7.21 | 11.59 |
| 4 | 10 | 7.20 | 10.93 |
| 5 | 12 | 7.17 | 9.25 |

Table III is an Experimental Data Record Table of the Volume Concentration Changes of P-Type Semiconductor Material Doped in the Hole Injection Material It can be seen from the experimental data in Table III that, when the volume concentration of the P-type semiconductor material doped in the hole injection material ranges from 1% to 10%, the organic light-emitting diode has a lower drive voltage and a higher luminous efficiency. For example, the volume concentration of the P-type semiconductor material can be 1.3%, 1.6%, 1.9%, 2%, 2.5%, 2.8%, 3.1%, 3.3%, 3.8%, 4%, 4.2%, 4.5%, 4.9%, 5%, 5.4%, 5.8%, 6%, 6.2%, 6.5%, 6.8%, 7%, 7.3%, 7.5%, 7.8%, 8%, 8.2%, 8.4%, 8.6%, 8.9%, 9%, 9.1%/9.4%, 9.7% and 9.9%, etc.

In an optional embodiment, the hole injection material includes the following compound:

Where $R_1$, $R_2$, $R_3$, $R_4$, $R_5$, $R_6$, $R_7$ and $R_8$ are all independently selected from at least one of hydrogen atom, substituted or unsubstituted C1-C6 alkyl, and substituted or unsubstituted C5-C15 aryl; and $R_9$, $R_{10}$, $R_{11}$ and $R_{12}$ respectively include an aromatic group.

Where substituted or unsubstituted C1-C6 alkyl exemplarily includes methyl, ethyl, propyl, n-butyl, isobutyl, n-amyl, isoamyl, neoamyl, n-hexyl or 2-methyl amyl, etc.

Where substituted or unsubstituted C5-C15 aryl exemplarily includes phenyl, tolyl, ethyl phenyl, xylyl, dibiphenylyl, naphthyl, or anthryl, etc.

Where $R_9$, $R_{10}$, $R_{11}$ and $R_{12}$ are respectively independently selected from substituted or unsubstituted phenyl, substituted or unsubstituted xenyl, substituted or unsubstituted condensed ring group or substituted or unsubstituted heterocyclic aryl.

The compound has multiple conjugated structures and is stable in performance, meanwhile, the nitrogen atoms are connected with three conjugated systems which are respectively $R_9$, $R_{10}$ and biphenyl, thereby being beneficial for the approach of the electron cloud towards the nitrogen atoms under the electrophilic effect of the nitrogen atoms, and then more holes are formed. Under the effect of big $\pi$ bond, the holes can move rapidly, so the compound can play a role of hole transport, and the transport speed of the holes is high. The holes generated by the P-type semiconductor material can transport rapidly in the hole injection material, then the movement rate of the holes is improved, and the holes can be rapidly combined with the electrons in the emitting layer to emit light, thereby improving the luminous efficiency of the organic light-emitting diode.

In an optional embodiment, a hole injection layer close to the anode and an electron transport layer close to the cathode are further arranged between the anode and the cathode, where the hole injection layer includes hole injection material and P-type semiconductor material doped in the hole injection material, and the electron transport layer includes electron transport material and ytterbium doped in the electron transport material.

In the present embodiment, the hole injection between the anode and the emitting layer also utilizes the hole injection material doped with P-type semiconductor material, then the hole transport speed between the anode and the emitting layer can be improved. The electron transport between the cathode and the emitting layer also utilizes the electron transport material doped with ytterbium, then the electron transport speed between the cathode and the emitting layer can be improved, thereby being beneficial for further lowering the drive voltage of the organic light-emitting diode and improving the luminous efficiency of the organic light-emitting diode.

In an optional embodiment of the present disclosure, the material of the electron transport layer includes a first group; the first group is of a conjugated structure which at least includes three continuous benzene rings, at least one carbon atom on the three continuous benzene rings is substituted by nitrogen atoms, and the first group is of an axisymmetric structure.

Optionally, the first group includes:

The material of the electron transport layer in the embodiment of the present disclosure includes a first group which plays the role of electron transport, then the speed of electron transport is increased, and the resistance is reduced, thereby lowering the drive voltage of the organic light-emitting diode; and the quantity of the electrons and the quantity of the holes in the emitting layer are matched, thereby improving the luminous efficiency of the organic light-emitting diode.

In specific embodiments, specific material of the emitting layer is not limited, for example, the emitting layer can be a fluorescent emitting layer and can also be a phosphorescent emitting layer, and materials of at least two emitting layers in the organic light-emitting diode can be identical and can also be not identical. For example, the organic light-emitting diode includes two emitting layers, the two emitting layers can be respectively a fluorescent emitting layer and a phosphorescent emitting layer, and the two emitting layers can also both be phosphorescent emitting layers or fluorescent emitting layers.

Specifically, the number of the emitting layers can be two and can also be three. For example, when the number of the emitting layers is two, the emitting layers can be respectively a blue emitting layer and a yellow emitting layer. When the number of the emitting layer is three, the emitting layers can be a blue emitting layer, a green emitting layer and a red emitting layer.

In one specific embodiment, the number of the emitting layers in the organic light-emitting diode can be three, and the three emitting layers are respectively a blue fluorescent emitting layer, a green phosphorescent emitting layer and a red phosphorescent emitting layer.

The embodiment of the present disclosure further provides a display panel, and the display panel includes the organic light-emitting diode described in any of the above technical solutions.

The display panel requires a lower drive voltage, then the power consumption is low, the luminous efficiency is high, and the display effect of the display panel is favorable.

Figure 6:
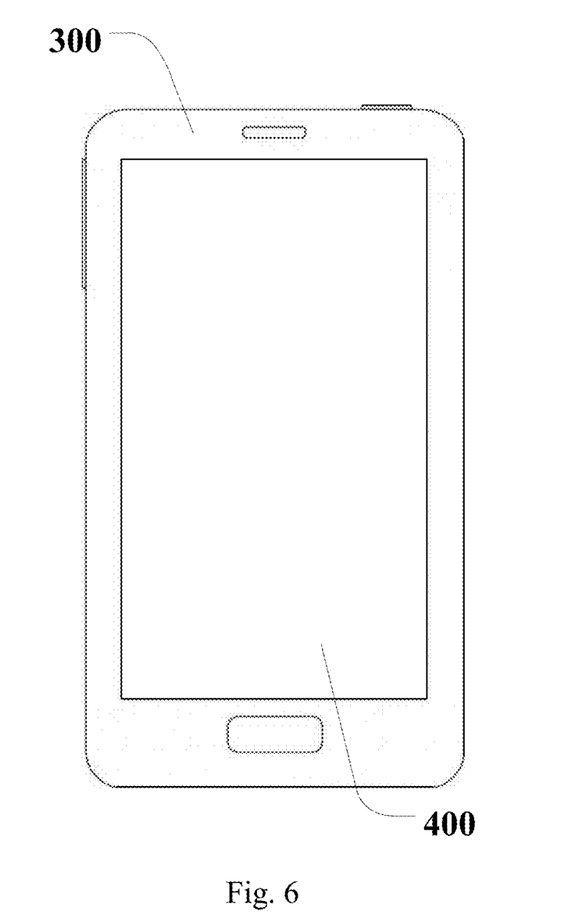
FIG. 6 is a schematic structural diagram of a display device in an embodiment of the present disclosure.

Please refer to FIG. 6. The embodiment of the present disclosure further provides a display device 300 which includes the above display panel 400.

The display panel included in the display device requires a lower drive voltage, then the power consumption is low, the luminous efficiency is high, the display effect of the display device can be improved, and the power consumption of the display device can be reduced.

In the embodiment of the present disclosure, the display device is not limited in specific types, and can be a mobile phone, a display, a tablet computer or a television. For example, the display device shown in FIG. 6 is a mobile phone.

Evidently, those skilled in the art can make various modifications and variations to the present disclosure without departing from the spirit and scope of the present disclosure. Accordingly the present disclosure is also intended to encompass these modifications and variations thereto so long as the modifications and variations come into the scope of the claims appended to the present disclosure and their equivalents.

What is claimed is:

1. An organic light-emitting diode, comprising an anode, a cathode, at least two emitting layers arranged between the anode and the cathode, and a charge generation layer arranged between the at least two adjacent emitting layers;
   wherein the charge generation layer comprises a first layer unit and a second layer unit, arranged in sequence between the at least two emitting layers, wherein the first layer unit comprises a hole injection material doped with a P-type semiconductor material, and wherein the second layer unit comprises an electron transport material doped with ytterbium, wherein a volume concentration of ytterbium doped in the electron transport material ranges from 1% to 5%;
   wherein the P-type semiconductor material comprises the following compound:

wherein n is an integer greater than or equal to 1, and $X_1$, $X_2$ and $X_3$ each respectively has an independent structure of R' is selected from any one of substituted aryl and substituted hetero aryl, and the substituent in the substituted aryl and substituted hetero aryl at least comprises one electron acceptor group.

2. The organic light-emitting diode according to claim 1, wherein a volume concentration of the P-type semiconductor material doped in the hole injection material ranges from 1% to 10%.

3. The organic light-emitting diode according to claim 1, wherein the hole injection material comprises the following compound:

wherein $R_1$, $R_2$, $R_3$, $R_4$, $R_5$, $R_6$, $R_7$ and $R_8$ are all independently selected from at least one of hydrogen atom, substituted or unsubstituted C1-C6 alkyl, and substituted or unsubstituted C5-C15 aryl; and $R_9$, $R_{10}$, $R_{11}$ and $R_{12}$ respectively comprise an aromatic group.

4. The organic light-emitting diode according to claim 1, wherein a hole injection layer close to the anode and an electron transport layer close to the cathode are arranged between the anode and the cathode, wherein the hole injection layer comprises the hole injection material and the P-type semiconductor material doped in the hole injection material, and wherein the electron transport layer comprises the electron transport material and ytterbium doped in the electron transport material.

5. The organic light-emitting diode according to claim 4, wherein a material of the electron transport layer comprises a first group,
wherein the first group is of a conjugated structure comprising three continuous benzene rings, wherein at least one carbon atom on the three continuous benzene rings is substituted by nitrogen atoms, and wherein the first group is of an axisymmetric structure.

6. The organic light-emitting diode according to claim 5, wherein the first group comprises:

7. The organic light-emitting diode according to claim 1, wherein the emitting layer comprises a fluorescent emitting layer or a phosphorescent emitting layer.

8. The organic light-emitting diode according to claim 1, wherein a number of the emitting layers is two or three.

9. A display panel, comprising an organic light-emitting diode, wherein the organic light-emitting diode comprises an anode, a cathode, at least two emitting layers arranged between the anode and the cathode, and a charge generation layer arranged between two adjacent emitting layers;
wherein the charge generation layer comprises a first layer unit and a second layer unit arranged in sequence between the anode and the cathode, wherein the first layer unit comprises a hole injection material doped with a P-type semiconductor material, and wherein the second layer unit comprises an electron transport material doped with ytterbium, wherein a volume concentration of ytterbium doped in the electron transport material ranges from 1% to 5%;
wherein the P-type semiconductor material comprises the following compound:

wherein n is an integer greater than or equal to 1, $X_1$, $X_2$ and $X_3$ each respectively has an independent structure of R' is selected from any one of substituted aryl and substituted hetero aryl, and the substituent in the substituted aryl and substituted hetero aryl at least comprises one electron acceptor group.

10. The display panel according to claim 9, wherein a volume concentration of the P-type semiconductor material doped in the hole injection material ranges from 1% to 10%.

11. The display panel according to claim 9, wherein the hole injection material comprises the following compound:

wherein $R_1$, $R_2$, $R_3$, $R_4$, $R_5$, $R_6$, $R_7$ and $R_8$ are all independently selected from at least one of hydrogen atom, substituted or unsubstituted C1-C6 alkyl, and substituted or unsubstituted C5-C15 aryl; and $R_9$, $R_{10}$, $R_{11}$ and $R_{12}$ respectively comprise an aromatic group.

12. The display panel according to claim 9, wherein a hole injection layer close to the anode and an electron transport layer close to the cathode are arranged between the anode and the cathode, wherein the hole injection layer comprises the hole injection material and the P-type semiconductor material doped in the hole injection material, and wherein the electron transport layer comprises the electron transport material and ytterbium doped in the electron transport material.

13. The display panel according to claim 12, wherein a material of the electron transport layer comprises a first group;
wherein the first group is of a conjugated structure comprising three continuous benzene rings, at least one carbon atom on the three continuous benzene rings is substituted by nitrogen atoms, and wherein the first group is of an axisymmetric structure.

14. The display panel according to claim 13, wherein the first group comprises:

15. The display panel according to claim 9, wherein the emitting layer comprises a fluorescent emitting layer or a phosphorescent emitting layer.

16. The display panel according to claim 9, wherein a number of the emitting layers is two or three.

17. A display device, comprising a display panel, the display panel comprising an organic light-emitting diode, wherein the organic light-emitting diode comprises an anode, a cathode, at least two emitting layers arranged between the anode and the cathode, and a charge generation layer arranged between two adjacent emitting layers;
wherein the charge generation layer comprises a first layer unit and a second layer unit arranged in sequence between the anode and the cathode, wherein the first layer unit comprises a hole injection material and a P-type semiconductor material doped in the hole injection material, and wherein the second layer unit comprises an electron transport material and ytterbium doped in the electron transport material, wherein a volume concentration of ytterbium doped in the electron transport material ranges from 1% to 5%;
wherein the P-type semiconductor material comprises the following compound:

wherein n is an integer greater than or equal to 1, $X_1$, $X_2$ and $X_3$ each has an independent structure of R' is selected from any one of substituted aryl and substituted hetero aryl, and the substituent in the substituted aryl and substituted hetero aryl at least comprises one electron acceptor group.

* * * * *